United States Patent
Yamazaki et al.

(10) Patent No.: US 8,785,216 B2
(45) Date of Patent: Jul. 22, 2014

(54) SUBSTRATE PROCESSING APPARATUS, SUBSTRATE PROCESSING METHOD, AND PROGRAM FOR IMPLEMENTING THE METHOD

(75) Inventors: Satoshi Yamazaki, Nirasaki (JP); Mitsuru Hashimoto, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 141 days.

(21) Appl. No.: 13/034,170

(22) Filed: Feb. 24, 2011

(65) Prior Publication Data

US 2011/0139749 A1    Jun. 16, 2011

Related U.S. Application Data

(62) Division of application No. 11/072,521, filed on Mar. 7, 2005, now abandoned.

(60) Provisional application No. 60/635,486, filed on Dec. 14, 2004.

(30) Foreign Application Priority Data

| Mar. 5, 2004 | (JP) | 2004-062982 |
| Sep. 24, 2004 | (JP) | 2004-277774 |
| Feb. 23, 2005 | (JP) | 2005-047362 |

(51) Int. Cl.
   *H01L 21/00*    (2006.01)
   *G06F 19/00*    (2011.01)

(52) U.S. Cl.
   USPC ............... 438/5; 700/121; 118/695; 118/696; 118/698; 118/699; 118/712; 118/715; 156/345.24; 427/569; 216/59

(58) Field of Classification Search
   USPC .............................. 156/345.24; 118/715, 712
   See application file for complete search history.

(56) References Cited

U.S. PATENT DOCUMENTS

| 5,943,230 A * | 8/1999 | Rinnen et al. ................... 700/18 |
| 6,090,718 A * | 7/2000 | Soga et al. ..................... 438/714 |

(Continued)

FOREIGN PATENT DOCUMENTS

| JP | 61-247015 | 11/1986 |
| JP | 2001-44090 | 2/2001 |

(Continued)

OTHER PUBLICATIONS

Japanese Office Action issued Mar. 6, 2012, in Patent Application No. 2005-047362 (with English-language translation).

(Continued)

*Primary Examiner* — Karla Moore
(74) *Attorney, Agent, or Firm* — Oblon, Spivak, McClelland, Maier & Neustadt, L.L.P.

(57) ABSTRACT

A substrate processing method which is capable of enhancing productivity in manufacturing product substrates. In process chambers of an etching apparatus, etching is carried out on a substrate as an object to be processed, and dummy processing is carried out on at least one non-product substrate before execution of the etching. A host computer determines whether or not the dummy processing is to be executed. The host computer determines whether or not the interior of each of the process chambers and is in a stable state, and omits the execution of the dummy processing when it is determined that it is in the stable state.

17 Claims, 13 Drawing Sheets

(56) References Cited

U.S. PATENT DOCUMENTS

| | | |
|---|---|---|
| 6,168,672 B1 | 1/2001 | Nguyen |
| 6,322,716 B1 | 11/2001 | Qiao et al. |
| 7,228,257 B1 | 6/2007 | Patrick et al. |
| 2002/0168806 A1 | 11/2002 | Tokuyama |
| 2003/0019840 A1* | 1/2003 | Smith et al. ............... 216/60 |
| 2004/0110388 A1* | 6/2004 | Yan et al. ................. 438/710 |
| 2005/0189070 A1* | 9/2005 | Tanaka et al. ......... 156/345.27 |

FOREIGN PATENT DOCUMENTS

| | | | |
|---|---|---|---|
| JP | 2001-176763 | | 6/2001 |
| JP | 2002-069633 | | 3/2002 |
| JP | 2002069633 A | * | 3/2002 |
| JP | 2002-170819 | | 6/2002 |
| JP | 2002170819 A | * | 6/2002 |
| JP | 2002-190468 | | 7/2002 |
| JP | 2003-129239 | | 5/2003 |
| JP | 2003-273077 | | 9/2003 |
| JP | 2004-31380 | | 1/2004 |
| WO | WO 03/103024 A2 | | 12/2003 |

OTHER PUBLICATIONS

Office Action mailed Oct. 17, 2006, in co-pending U.S. Appl. No. 11/072,521.

Office Action mailed Feb. 22, 2007, in co-pending U.S. Appl. No. 11/072,521.

Office Action mailed Oct. 26, 2007, in co-pending U.S. Appl. No. 11/072,521.

Office Action mailed Apr. 18, 2008, in co-pening U.S. Appl. No. 11/072,521.

Office Action issued Oct. 12, 2011, in Japanese Patent Application No. 2005-047362 (with English-language translation).

\* cited by examiner

FIG. 3

| P1 RECIPE EDITING | | RECIPE NAME | UNDEFINED | | SLOT STATUS DISPLAY | APPARATUS STATUS DISPLAY | Offline | 200X/YY/ZZ 17:18:43 |
|---|---|---|---|---|---|---|---|---|

| | P1 | P1RCP | | | | | | |
|---|---|---|---|---|---|---|---|---|

| | STEP 1 | STEP 2 | STEP 3 | STEP 4 | STEP 5 | STEP 6 |
|---|---|---|---|---|---|---|
| STEP TERMINATING CONDITION | TIME | STABLE | END | END | END | END |
| END POINT DETECTING UNIT | -------- | -------- | -------- | -------- | -------- | -------- |
| STEP PROCESSING TIME | 01:00.0 | 00:30.0 | -------- | -------- | -------- | -------- |
| STEP DECAYING TIME | -------- | -------- | -------- | -------- | -------- | -------- |
| OVERETCH [x] | NO SETTING | | | | | |
| VARIABLE | | | | | | |
| GAP [nm] | 17.0 | 17.0 | 17.0 | 17.0 | 17.0 | 17.0 |
| CHAMBER PRESSURE [Pa] | 0.0 | 0.0 | 0.0 | 0.0 | 0.0 | 0.0 |
| UPPER RF POWER [W] | 2000 | 1000 | 0 | 0 | 0 | 0 |
| LOWER RF POWER [W] | 2000 | 1000 | 0 | 0 | 0 | 0 |
| 00 [SCCM] | 10 | 0 | 0 | 0 | 0 | 0 |
| 00 [SCCM] | 20 | 0 | 0 | 0 | 0 | 0 |
| 02 [SCCM] | 10.0 | 0.0 | 0.0 | 0.0 | 0.0 | 0.0 |

| END | CANCEL | READ | SAVE | PARAMETER EDIT | END POINT DETECTING CONDITION EDIT | STATIC CHARGE REMOVING CONDITION EDIT | NEXT PAGE |

FIG. 7

| | 000 | | | | | ☼ | 📺 200X/YY/ZZ 17:44:59 |
|---|---|---|---|---|---|---|---|
| | APPARATUS CONFIGURATION PARAMETER | UNDEFINED | SLOT STATUS DISPLAY | APPARATUS STATUS DISPLAY | | Offline | SCREEN SELECTION |

| ITEM | SET VALUE |
|---|---|
| 3 CHAMBER STANDING TIME | 00:00:00 |
| 1 BCR RETRY TIMER COUNT (2) | 2 |
| 1 BCR EXCLUSIVE TIMER COUNT (3) | 3 |
| 0 QMT OFF LOT | DISABLED |
| 0 FILM THICKNESS INPUT FUNCTION | DISABLED |
| 3 OR TRANSFER PATH SWITCHING FUNCTION | NO ADDITIONAL FUNCTION |
| 0 ADDITION OF DETAILED LOG DATA FOR EACH SUBSTRATE LOT | DISABLED |
| 3 DUMMY WAFER LOG REGISTRATION | ENABLED |
| 1 INHIBITION OF WAFER TRANSFER FROM SCREEN | DISABLED |
| 9 PARALLEL TRANSFER TYPE | UNUSED |
| 0 MACHINE TYPE | STANDARD |
| 1 CONTINUOUS TRANSFER-TIME HOST PRODUCT START | DISABLED |
| 3 RECIPE RESTORING MODE | FLOW RATE/GAS NAME CHECK |
| 3 WAFER-LESS PLASMA CLEANING FUNCTION | DISABLED |
| 0 APPARATUS PARAMETER ID DISPLAY FUNCTION | DISABLED |
| 3 PROCESS LOG STORAGE ERROR COPING | FORCIBLE TERMINATION |
| 3 CHAMBER STANDING TIME | 00:00:00 |

| END | CANCEL | SAVE | ASC II SAVE | NONSTANDARD PARAMETER DISPLAY | | | |
|---|---|---|---|---|---|---|---|

600

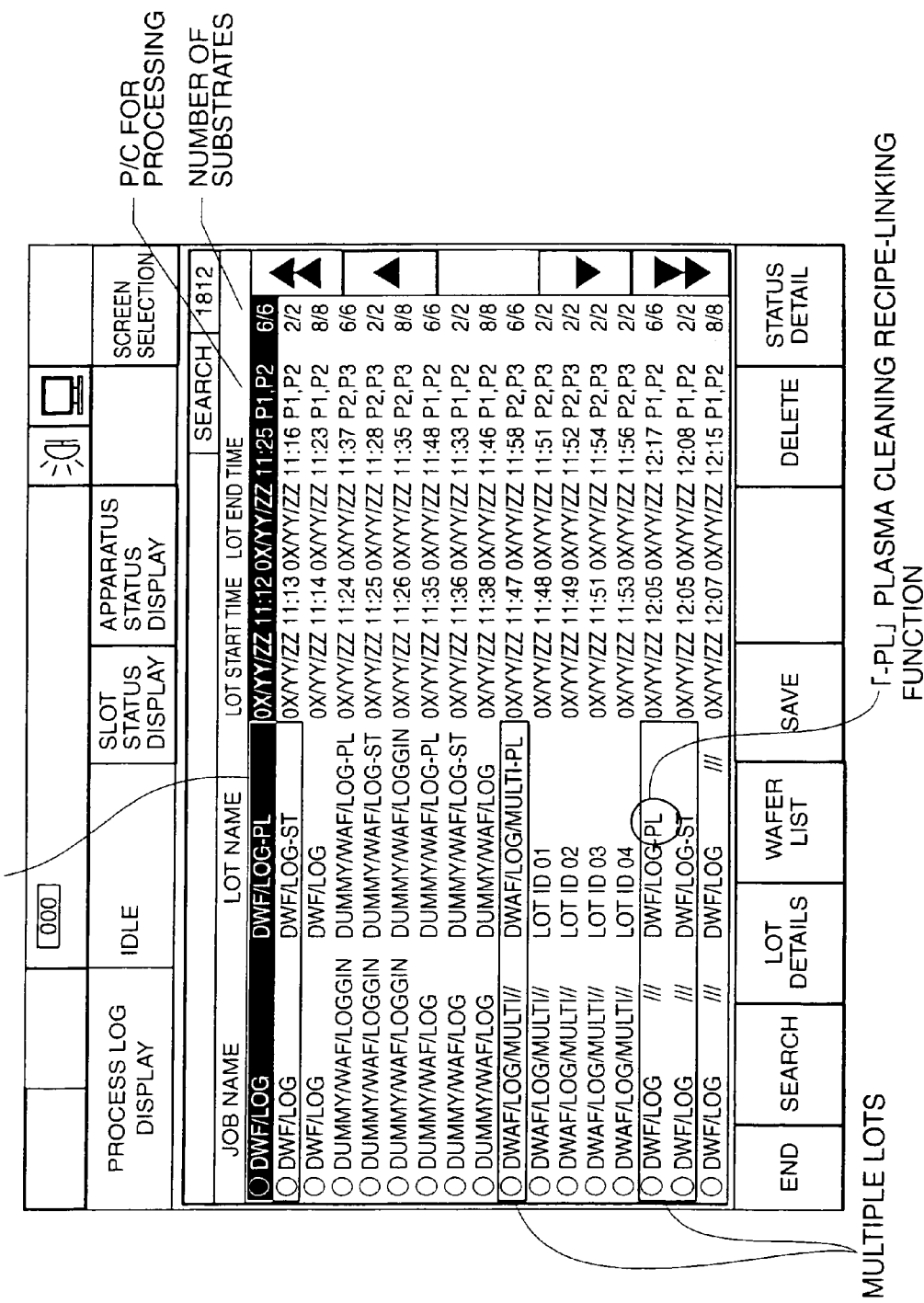

FIG. 9B

| | WAFER LIST | | | IDLE | | SLOT STATUS DISPLAY | APPARATUS STATUS DISPLAY | | | SCREEN SELECTION |
|---|---|---|---|---|---|---|---|---|---|---|
| LOT NAME | DWF/LOG-ST | | | JOB NAME | DWF/LOG | | LOT START TIME | 0X/YY/ZZ 11:12 | | |
| P/C NUMBER | 1 | | | RECIPE NAME | Z030 | | LOT START TIME | 0X/YY/ZZ 11:25 | | |
| NUMBER OF PROCESSED SUBSTRATES | 3 | | | | | | | | | |

| SLOT | | RF1 CHAMBER PRESSURE | RF1 LOWER RF POWER | RF1 LOWER RF REFLECTED POWER | | | | |
|---|---|---|---|---|---|---|---|---|
| ○ | LOT | 3.0E+1 | 100.0 | -500.0 | ---- | ---- | ---- | ---- |
| ● | 1-D2 | 3.0E+1 | 100.0 | -500.0 | ---- | ---- | ---- | ---- |
| ○ | 1-D3 | 3.0E+1 | 100.0 | -500.0 | ---- | ---- | ---- | ---- |
| ○ | 1-D2 | 3.0E+1 | 100.0 | -500.0 | ---- | ---- | ---- | ---- |

[-Dx] DUMMY SLOT NUMBER

SUBSTRATE PROCESSING APPARATUS, SUBSTRATE PROCESSING METHOD, AND PROGRAM FOR IMPLEMENTING THE METHOD

CROSS REFERENCE

This application is a division of and is based upon and claims the benefit of priority under 35 U.S.C. §120 for U.S. Ser. No. 11/072,521, filed Mar. 7, 2005, the entire contents of which are incorporated herein by reference, and the benefit of priority under 35 U.S.C. §119(e) for U.S. Provisional Application No. 60/635,486, filed on Dec. 14, 2004, and claims the benefit of priority under 35 U.S.C. §119 from Japanese Patent Application No. 2004-062982, filed Mar. 5, 2004, Japanese Patent Application No. 2004-277774, filed Sep. 24, 2004, Japanese Patent Application No. 2005-047362, filed Feb. 23, 2005.

BACKGROUND OF THE INVENTION

1. Field of the Invention

The present invention relates to a substrate processing apparatus, a substrate processing method, and a program for implementing the method, and more particularly to a substrate processing apparatus and a substrate processing method which are capable of carrying out dummy processing, and a program for implementing the method.

2. Description of the Related Art

In a plasma process for manufacturing semiconductor chips, etching on thin films and CVD (Chemical Vapor Deposition) which deposits a metal on the etched thin films are carried out, by utilizing interaction between plasma and the inner wall of a vessel. In the vessel, large energy is applied e.g. by high frequency waves, so that the interaction between plasma and the vessel inner wall causes the following serious problem:

The plasma CVD grows a thin film on a substrate, but the thin film is also deposited on the vessel inner wall as well. On the other hand, the etching process shaves off the film formed on the substrate by subjecting the same to a chemical reaction, so that reaction products are decomposed by plasma and deposit on the vessel inner wall. As the plasma process is continued, the vessel inner wall is contaminated as described above, which adversely affects chemical reactions in plasma and degrades reproducibility of the process.

Therefore, in mass production plants, a vacuum vessel provided in a semiconductor chip manufacturing apparatus (substrate processing apparatus) is periodically cleaned so as to enhance the availability or rate of operation of the apparatus. In addition, a seasoning (aging) process is carried out after cleaning so as to maintain the inner wall of the vacuum vessel in a predetermined condition. To carry out the seasoning and warming-up of the apparatus, as well as to establish processing conditions for substrates included in one lot, the semiconductor chip manufacturing apparatus is provided with a function of carrying out dummy processing on a non-product substrate before execution of product processing including the plasma process.

Conventionally, to prevent occurrence of human operating errors, the dummy processing is carried out by an automatic process in which timing for the dummy processing and that for the product processing are collectively managed as a single sequence by on-line control.

In a first method for carrying out the above-mentioned automatic process, a dummy recipe for the dummy processing is linked to (registered in) a recipe for the product processing (which will be referred to as "the dummy processing recipe-linking function"), whereby the dummy processing is carried out on a non-product substrate before each execution of the product processing on a substrate lot (see e.g. Japanese Laid-Open Patent Publication (Kokai) No. 2001-176763).

In a second method for carrying out the automatic process, time intervals at which the cleaning is periodically performed are determined based on a process chamber operating parameter, such as a cumulative time period of RF (radio frequency) power discharge in a process chamber, which is set by a maintenance and management function, or the number of processed substrates (see e.g. U.S. Pat. No. 6,168,672).

In the above-mentioned first and second methods for the automatic process, however, even when the processing atmosphere in (i.e. the status of the interior of) the process chamber is stable as in the case of the product processing being continuously executed on substrate lots under the same processing conditions, a non-product substrate is subjected to the dummy processing whenever a substrate lot is subjected to the product processing or periodically, which causes not only wasteful use of non-product substrates, but also a decrease in throughput (processing capability) and hence degraded productivity in manufacturing product substrates.

Further, when the processing atmosphere in (i.e. the status of the interior of) the process chamber is unstable, it is necessary to carry out dummy processing repeatedly.

SUMMARY OF THE INVENTION

It is an object of the present invention to provide a substrate processing apparatus and a substrate processing method which are capable of enhancing productivity in manufacturing product substrates, and a program for implementing the method.

To attain the above object, in a first aspect of the present invention, there is provided a substrate processing apparatus comprising at least one process chamber in which predetermined processing is carried out on a substrate as an object to be processed, dummy processing means for carrying out dummy processing on a non-product substrate, and determining means for determining whether or not the dummy processing is to be executed, wherein the determining means includes stability determining means for determining whether or not an interior of the process chamber is in a stable state, and the dummy processing means includes dummy processing omitting means for omitting execution of the dummy processing when the stability determining means determines that the interior of the process chamber is in the stable state.

With the arrangement of the first aspect of the present invention, when it is determined that the status of the interior of the process chamber is stable, execution of the dummy processing is omitted, which contributes to enhancement of productivity in manufacturing product substrates.

Preferably, when a standing time over which the process chamber is left standing and counting of which is started from a time count start reference time set to an execution end time of the predetermined processing has not exceeded a predetermined time period, the stability determining means determines that the interior of the process chamber is in the stable state.

More preferably, the determining means performs the determination based on preset dummy processing execution requirements or dummy processing non-execution requirements, the dummy processing non-execution requirements including a condition that the standing time does not exceed the predetermined time period.

Further preferably, the dummy processing non-execution requirements include a condition that the non-product substrate does not exist.

Further preferably, the dummy processing non-execution requirements include a condition that execution of the dummy processing on the non-product substrate before execution of the predetermined processing on the substrate is not designated.

Further preferably, the dummy processing execution requirements include a condition that it is configured such that omission of execution of the dummy processing by the dummy processing omitting means is disabled.

Further preferably, the dummy processing execution requirements include a condition that the process chamber is in an off-line state.

Further preferably, the dummy processing execution requirements include a condition that the substrate is a first substrate to be processed after power of the substrate processing apparatus is turned on.

Further preferably, the dummy processing execution requirements include a condition that a substrate processed before the substrate was processed in an off-line state.

Further preferably, the dummy processing execution requirements include a condition that the substrate is a first substrate to be processed after execution of maintenance of the process chamber.

Further preferably, the dummy processing execution requirements include a condition that abort processing for forcibly terminating processing being executed was executed on a substrate which was being processed immediately before processing of the substrate.

Preferably, when the stability determining means determines that the interior of the process chamber is not in the stable state, the dummy processing means carries out the dummy processing once.

More preferably, processing time of the dummy processing carried out once is longer than processing time of the predetermined processing to be carried out on the substrate.

More preferably, a set value of power required for the dummy processing to be carried out once is higher than a set value of power required for the predetermined processing to be carried out on the substrate.

Preferably, the determining means performs the determination for each substrate lot including the substrate.

Preferably, the substrate processing apparatus comprises abort processing setting means for allowing setting to be made as to whether or not the abort processing is to be executed on the substrate, after abort processing for forcibly terminating processing being executed was executed on a substrate which was being processed immediately before processing of the substrate.

Preferably, the substrate processing apparatus comprises log recording means for recording a log indicative of whether or not execution of the dummy processing was omitted.

To attain the above object, in a second aspect of the present invention, there is provided a substrate processing method for a substrate processing apparatus including at least one process chamber in which predetermined processing is carried out on a substrate as an object to be processed, comprising a dummy processing step of carrying out dummy processing on a non-product substrate, and a determining step of determining whether or not the dummy processing is to be executed, wherein the determining step includes a stability determining step of determining whether or not an interior of the process chamber is in a stable state, and the dummy processing step includes a dummy processing omitting step of omitting the execution of the dummy processing when it is determined in the stability determining step that the interior of the process chamber is in the stable state.

Preferably, when a standing time over which the process chamber is left standing and counting of which is started from a time count start reference time set to an execution end time of the predetermined processing has not exceeded a predetermined time period, it is determined in the stability determining step that the interior of the process chamber is in the stable state.

More preferably, the determination in the determining step is performed based on preset dummy processing execution requirements or dummy processing non-execution requirements, the dummy processing non-execution requirements including a condition that the standing time does not exceed the predetermined time period.

Further preferably, the dummy processing non-execution requirements include a condition that the non-product substrate does not exist.

Further preferably, the dummy processing non-execution requirements include a condition that execution of the dummy processing on the non-product substrate before execution of the predetermined processing on the substrate is not designated.

Further preferably, the dummy processing execution requirements include a condition that it is configured such that omission of execution of the dummy processing in the dummy processing omitting step is disabled.

Further preferably, the dummy processing execution requirements include a condition that the process chamber is in an off-line state.

Further preferably, the dummy processing execution requirements include a condition that the substrate is a first substrate to be processed after power of the substrate processing apparatus is turned on.

Further preferably, the dummy processing execution requirements include a condition that a substrate processed before the substrate was processed in an off-line state.

Further preferably, the dummy processing execution requirements include a condition that the substrate is a first substrate to be processed after execution of maintenance of the process chamber.

Further preferably, the dummy processing execution requirements include a condition that abort processing for forcibly terminating processing being executed was executed on a substrate which was being processed immediately before processing of the substrate.

Preferably, when it is determined in the stability determining step that the interior of the process chamber is not in the stable state, the dummy processing is carried out once in the dummy processing step.

More preferably, processing time of the dummy processing carried out once is longer than processing time of the predetermined processing to be carried out on the substrate.

More preferably, a set value of power required for the dummy processing to be carried out once is higher than a set value of power required for the predetermined processing to be carried out on the substrate.

Preferably, the determining step comprises performing determination for each substrate lot including the substrate.

Preferably, the substrate processing method comprises an abort processing setting step of allowing setting to be made as to whether or not the abort processing is to be executed on the substrate, after abort processing for forcibly terminating processing being executed was executed on a substrate which was being processed immediately before processing of the substrate.

Preferably, the substrate processing method comprises a log recording step of recording a log indicative of whether or not execution of the dummy processing was omitted.

To attain the above object, in a third aspect of the present invention, there is provided a program for causing a computer to execute a substrate processing method for a substrate processing apparatus including at least one process chamber in which predetermined processing is carried out on a substrate as an object to be processed, comprising a dummy processing module for carrying out dummy processing on a non-product substrate, and a determining module for determining whether or not the dummy processing is to be executed, wherein the determining module includes a stability determining module for determining whether or not an interior of the process chamber is in a stable state, and the dummy processing module includes a dummy processing omitting module for omitting the execution of the dummy processing when the stability determining module determines that the interior of the process chamber is in the stable state.

The above and other objects, features, and advantages of the invention will become more apparent from the following detailed description taken in conjunction with the accompanying drawings.

BRIEF DESCRIPTION OF THE DRAWINGS

FIG. 3 is a view useful in explaining a product processing recipe registered in advance in a host computer appearing in FIG. 1;

FIG. 7 is a view useful in explaining detailed requirements for execution of the dummy processing configured as explained with reference to FIG. 5;

FIG. 9A is a view showing an example of a process log recorded in the host computer;

FIG. 9B is a fragmentary view showing an example of a dummy process log as a result of execution of dummy processing on non-product substrates;

DETAILED DESCRIPTION OF THE PREFERRED EMBODIMENTS

The present invention will now be described in detail with reference to the drawings showing a preferred embodiment thereof.

Figure 1:
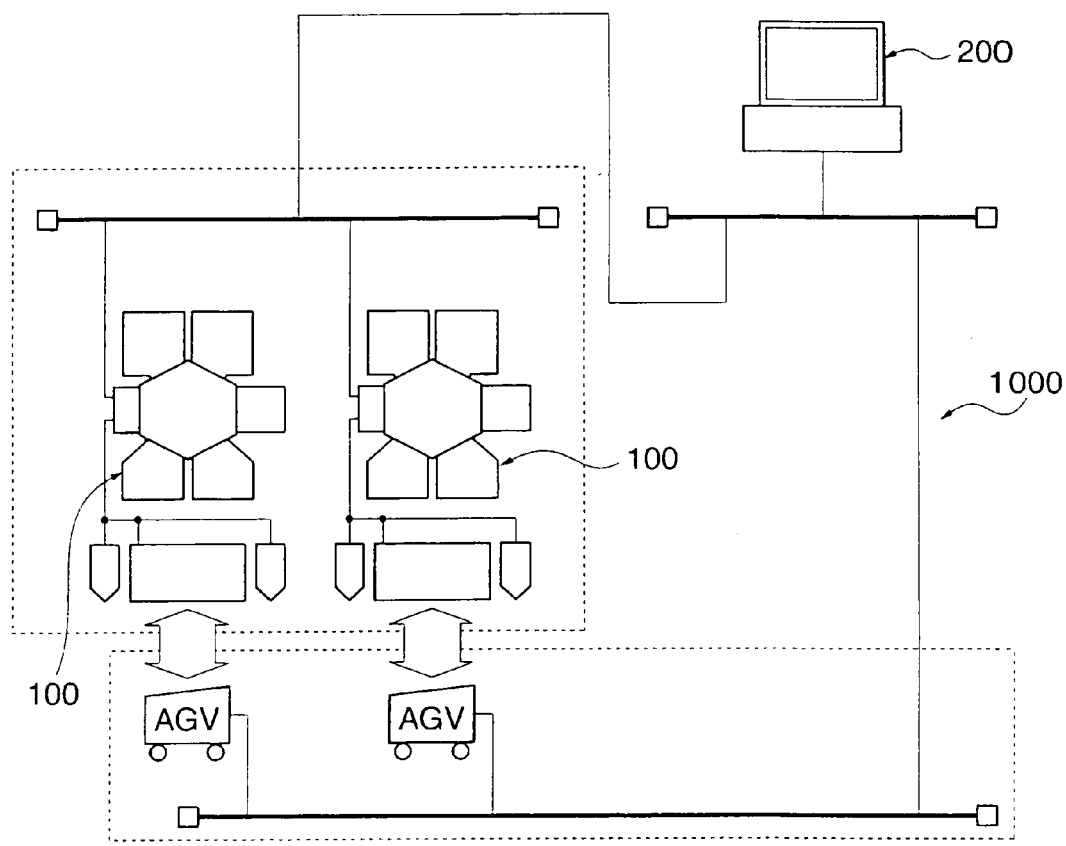
FIG. 1 is a block diagram schematically showing the arrangement of a substrate processing system including a substrate processing apparatus according to an embodiment of the present invention.

FIG. 1 is a block diagram schematically showing the arrangement of a substrate processing system including a substrate processing apparatus according to an embodiment of the present invention.

The substrate processing system 1000 shown in FIG. 1 is comprised of at least one etching apparatus 100 as a substrate processing apparatus, an auto guided vehicle (AGV) for conveying a cassette, referred to hereinafter, containing semiconductor substrates (hereinafter simply referred to as "substrates") to the etching apparatus 100, and a host computer 200 connected to the AGV and the etching apparatus 100 via a network.

A transfer recipe, a product processing recipe, and a dummy processing recipe, all of which will be described in detail hereinafter, are registered in advance as programs in the host computer 200, and based on unattended control by the on-line host computer 200, the etching apparatus 100 automatically carries out operations for transferring non-product substrates for dummy processing, substrates to be subjected to product processing, and substrates already subjected to product processing, and steps of dummy processing, described in detail hereinafter, and steps of etching (product processing), also described in detail hereinafter.

Figure 2:
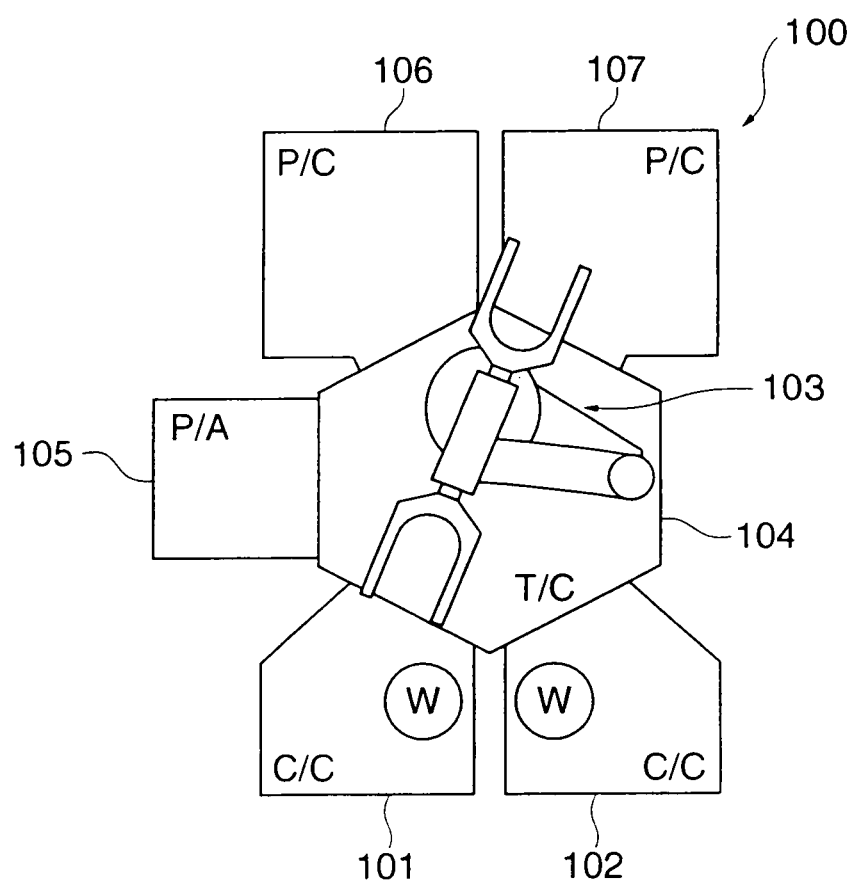
FIG. 2 is a top view schematically showing the arrangement of an etching apparatus appearing in FIG. 1.

FIG. 2 is a top view schematically showing the arrangement of the etching apparatus 100 appearing in FIG. 1.

As shown in FIG. 2, the etching apparatus 100 is comprised of cassette chambers (C/C) 101 and 102 on each of which a cassette transferred from the AGV is placed, a transfer chamber (T/C) 104 adjacent to the cassette chambers 101 and 102 and having a turning arm 103, referred to hereinafter, mounted therein, a pre-alignment section (P/A) 105 adjacent to the transfer chamber 104, and process chambers (P/C) 106 and 107 adjacent to the transfer chamber 104.

Each cassette contains substrates (W) including non-product substrates for dummy processing as well as substrates to be subjected to product processing and substrates already subjected to product processing. The cassette contains three non-product substrates, for example, on its lowermost stage. The turning arm 103 in the transfer chamber 104 is disposed such that it can transfer substrates one by one between the cassette chambers 101 and 102, the pre-alignment section 105, and the process chambers 106 and 107.

In each of the process chambers 106 and 107, plasma is generated under a vacuum processing atmosphere, based on the product processing recipe preset in the host computer 200. The plasma can be generated by applying radio frequency (RF) power between upper and lower electrode plates provided parallel to each other in the process chamber 106 (107).

The etching apparatus 100 carries out etching on substrates under the processing atmosphere containing the plasma generated in the process chambers 106 and 107, based on etching conditions described in detail hereinafter. The dummy processing is carried out for stabilization of the processing atmosphere, particularly, temperature and pressure, before execution of etching on the substrates, or for test operation or warming up of the apparatus, or for cleaning and seasoning (aging) after the cleaning. The dummy processing is also executed so as to establish processing conditions for a substrate lot contained in the cassette.

FIG. 3 is a view useful in explaining the product processing recipe registered in advance in the host computer 200 in FIG. 1.

As shown in FIG. 3, the product processing recipe is set in the host computer 200 via a display screen of the host computer 200 and linked to (registered in) the transfer recipe described in detail hereinafter. Product processing recipes are provided in association with respective ones of the process chambers 106 and 107, and detailed etching conditions and the like are entered in the recipe. The etching conditions include a processing time period of etching (main step), values of the supply flow rates of process gases, such as a carbon fluoride (CF) gas, a fluorinated hydrocarbon (CHF) gas, a hydrobromine (HBr) gas, a chlorine ($Cl_2$) gas, an argon (Ar) gas, a carbon monoxide (CO) gas, and an oxygen ($O_2$) gas, mixture ratios of process gases, values of pressure in the process chambers, the distance between the upper electrode plate and the lower electrode plate, a value of electric power to be applied to the upper and lower electrode plates, residence timer representative of an evacuation time period, substrate temperature, and so forth.

In the following, a description will be given of a substrate transfer operation carried out by the etching apparatus 100. This substrate transfer operation is carried out based on the transfer recipe preset in the host computer 200.

First, the turning arm 103 transfers a substrate to be subjected to product processing or a non-product substrate for dummy processing to the pre-alignment section 105 from a cassette containing the substrates. The substrate has an orientation flat thereof, i.e. a flat outer peripheral surface thereof aligned (positioned) in the pre-alignment section 105, and is then transferred into one of the process chambers 106 and 107. An etched substrate is transferred into a cassette in a designated one of the cassette chambers 101 and 102, e.g. at the same position as the storage position where the substrate was stored before the processing.

Figure 4:
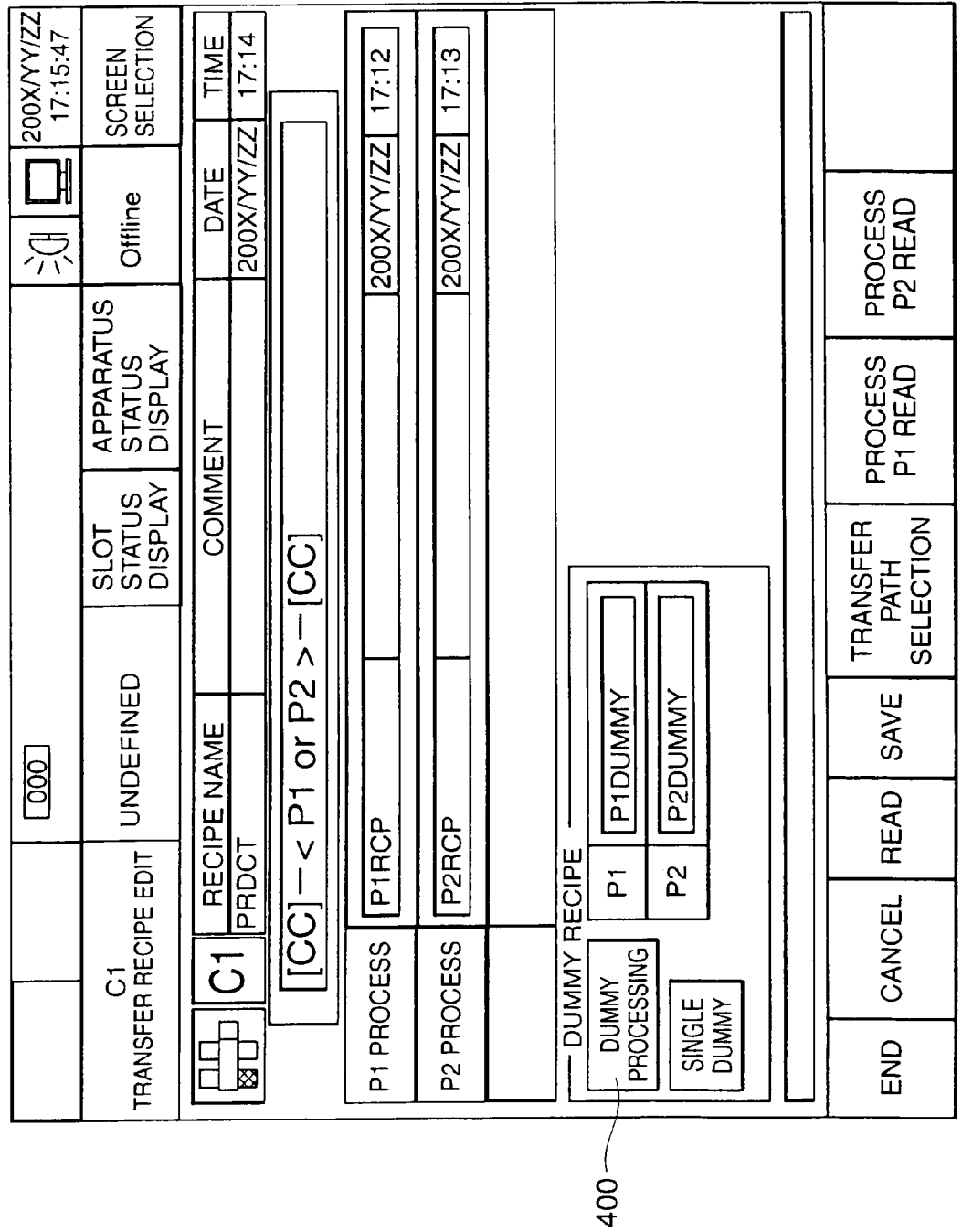
FIG. 4 is a view useful in explaining a transfer recipe registered in advance in the host computer appearing in FIG. 1.

FIG. 4 is a view useful in explaining the transfer recipe registered in advance in the host computer 200 in FIG. 1.

As shown in FIG. 4, transfer recipes are provided in association with respective ones of the cassette chambers 101 and 102, and designations are made in the host computer 200 via the display screen of the host computer 200. For example, in the transfer recipe, designations are made as to whether a substrate to be transferred by the turning arm 103 is a substrate for product processing or a non-product substrate for dummy processing, whether a cassette to or from which a substrate is to be transferred is one in the cassette chamber 101 or one in the cassette chamber 102, whether a process chamber to which a substrate is to be transferred is the process chamber 106 or the process chamber 107, and so forth.

Figure 5:
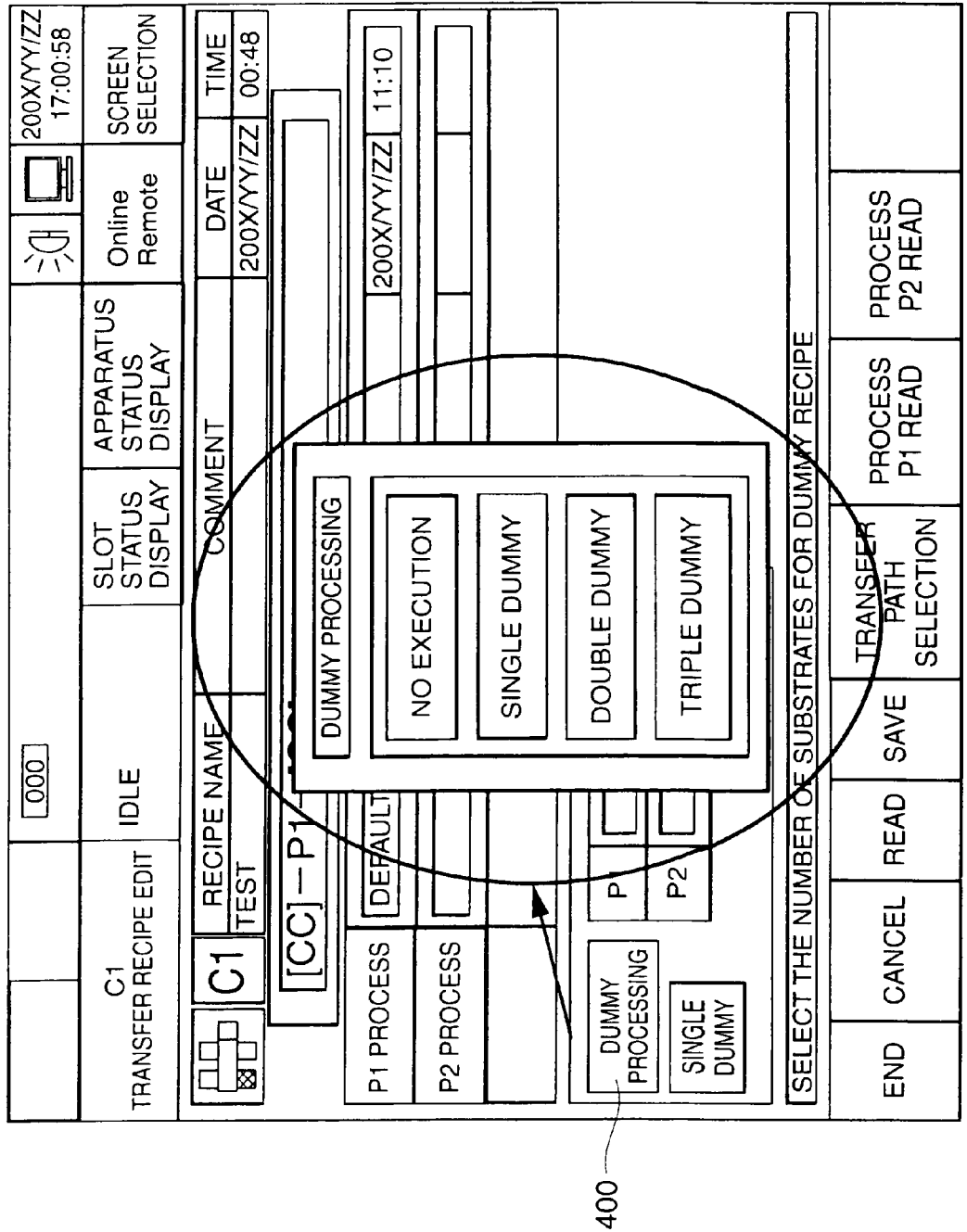
FIG. 5 is a view useful in explaining dummy processing for which settings can be made via a screen displaying the transfer recipe in FIG. 4.

FIG. 5 is a view useful in explaining dummy processing for which settings can be made via a screen displaying the transfer recipe in FIG. 4.

As shown in FIGS. 4 and 5, a link button 400 for enabling a change in the settings of dummy processing is provided on the screen of the host computer 200 displaying the transfer recipe, and therefore, by operating the link button 400, it is possible to set whether or not to carry out dummy processing, and to set the number of non-product substrates to be used for the dummy processing (dummy processing recipe-linking function). Since the screen displaying the transfer recipe is provided with the link button 400, the settings of the dummy processing recipe as well as those of the transfer recipe can be easily changed so as to prevent occurrence of human operating errors.

If execution of dummy processing is selected on the display screen in FIG. 5, the dummy processing is carried out on a designated number of non-product substrates that has been set, before execution of etching on a substrate lot contained in the associated cassette.

Further, it is possible to further configure or set detailed requirements for execution of the dummy processing set on the display screen in FIG. 5 (see FIG. 7).

Figure 6:
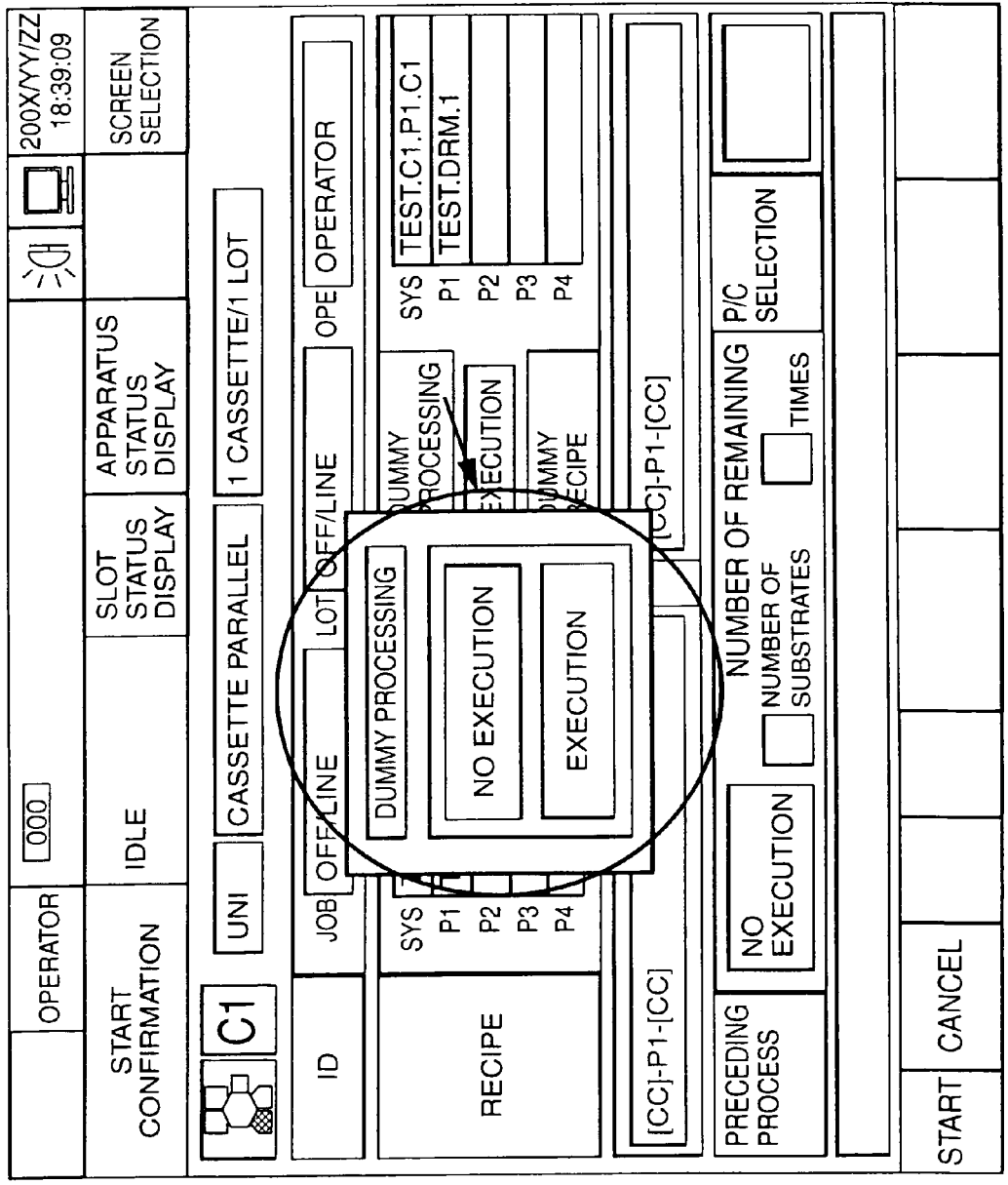
FIG. 6 is a view of a start confirmation screen displayed on a display screen of the host computer in FIG. 1 before starting the transfer of a substrate lot to be subjected to product processing.

FIG. 6 is a view of a start confirmation screen displayed on the display screen of the host computer 200 in FIG. 1 before the start of transfer of a substrate lot to be subjected to product processing.

As shown in FIG. 6, also on the present start confirmation screen, the setting as to whether to carry out the preset dummy processing can be changed (lot stabilizing dummy processing function). Further, the settings of the dummy processing that have already been made can also be changed. This makes it possible to prevent occurrence of human operating errors, such as a careless omission of setting of the dummy processing, an error in inputting a set value, or an error in selecting an option (button).

FIG. 7 is a view useful in explaining the detailed requirements for execution of the dummy processing set on the display screen in FIG. 5.

Using the display screen of the host computer 200, shown in FIG. 7, it is possible to change preset values of configuration parameters of the etching apparatus 100. The preset values of the configuration parameters can be changed during idle time of the process chambers 106 and 107 of the etching apparatus 100.

The detailed requirements for execution of the dummy processing are determined by changing the preset value of a parameter 600, i.e. a "chamber standing time" as a time period over which each of the process chambers 106 and 107 is left standing, which is included in the items of the configuration parameters.

The initial set value of the parameter 600 is a time period "00:00:00". When the time period "00:00:00" is set, the host computer 200 controls the etching apparatus 100 such that dummy processing is carried out on a non-product substrate before execution of each etching on a substrate lot, as in the case of the conventional dummy processing.

When a predetermined time period is entered as a set value of the parameter 600, the host computer 200 counts the entered predetermined time period starting from a time count start reference time set to the execution end time of the main step, i.e. etching executed on a substrate lot. When the predetermined time period has elapsed, dummy processing is carried out on a non-product substrate before execution of each etching on a substrate lot, as in the case of the conventional dummy processing. On the other hand, when execution of etching on a following substrate lot to be processed next (hereinafter referred to "the following substrate lot") is started before the lapse of the predetermined time period, the dummy processing, which should otherwise have been executed as in the case of the conventional dummy processing, is omitted (dummy processing-improving function).

It is preferable that the lower limit value of the parameter 600 is set e.g. to approximately fifteen minutes except when set to the time period "00:00:00" indicative of disabling of the dummy processing-improving function. When the lower limit value of the parameter 600 is set to approximately fifteen minutes, it is possible to set the chamber standing time to a time period longer than the time interval between successive lot transfers. The chamber standing time can be set to a shorter time period (e.g. one second) than the time interval between successive lot transfers, but when substrate lots are successively transferred, dummy processing is carried out on non-product substrates without activating the dummy processing-improving function.

The upper limit of the set value of the parameter 600 is preferably a time period over which the processing atmosphere, particularly stability of temperature and pressure thereof, can be maintained in a process chamber used by the user for product processing on an immediately preceding substrate lot (hereinafter referred to as "the preceding substrate lot"), e.g. approximately three hours, and more preferably, approximately one hour. In other words, the upper limit value of the parameter 600 is empirically determined, and therefore it may be determined based on not only temperature and pressure, but also a time period over which product processing is carried out on the preceding substrate lot, the etch rate, selection ratio, uniformity, and so forth of the product processing.

More specifically, whether or not the dummy processing described above needs to be executed is determined as follows.

Figure 8:
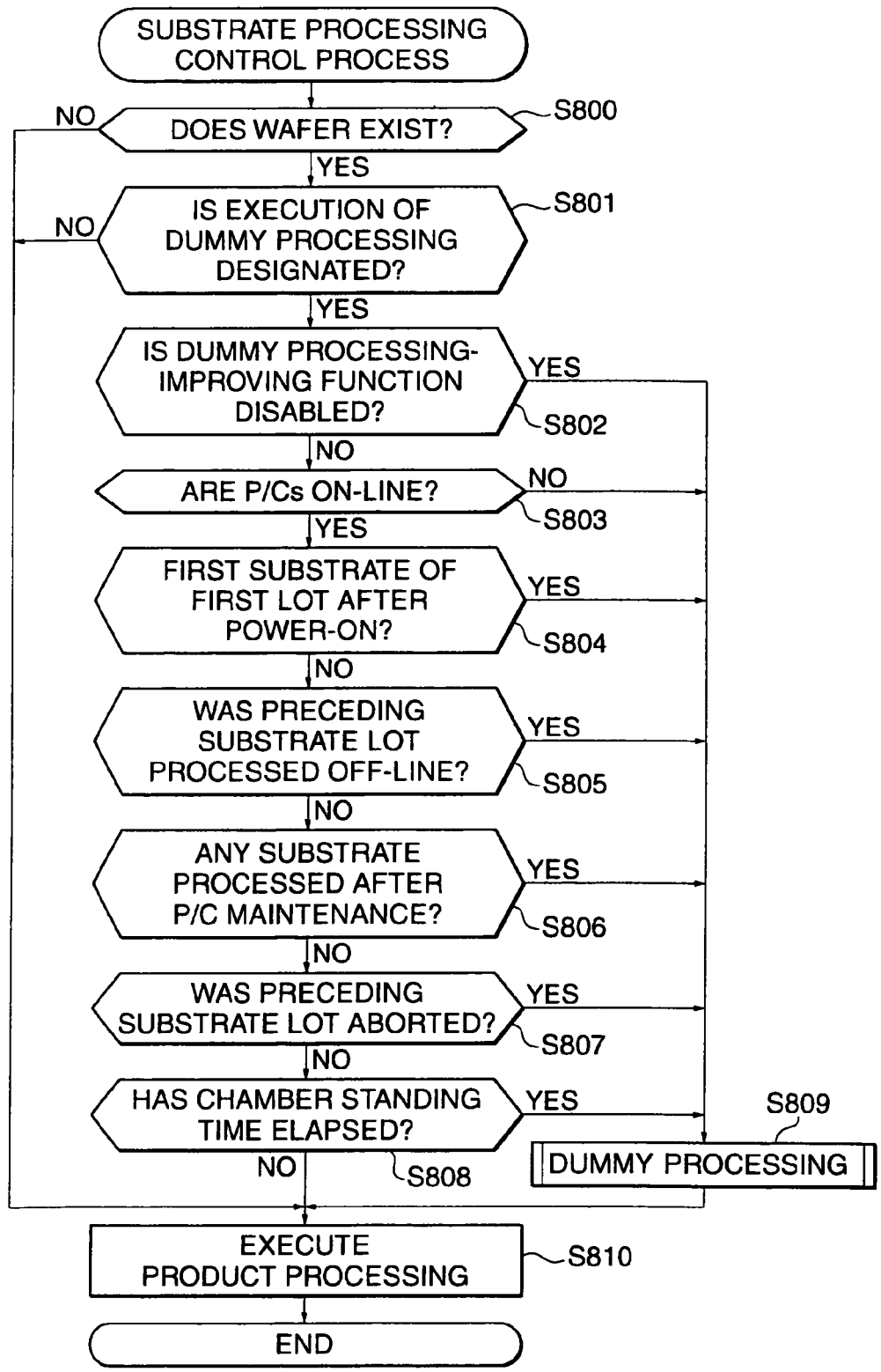
FIG. 8 is a flowchart of a substrate processing control process executed by the host computer in FIG. 1.

FIG. 8 is a flowchart of a substrate processing control process executed by the host computer 200 in FIG. 1.

As shown in FIG. 8, first, it is determined in a step S800 whether or not there is a non-product substrate contained in a cassette. If there is a non-product substrate, it is determined whether or not execution of dummy processing on the non-product substrate before execution of etching on the substrate lot contained in the cassette is designated (step S801). If there is no non-product substrate, or if execution of dummy processing is not designated, the process proceeds to a step S810, referred to hereinafter.

If it is determined in the step S801 that execution of dummy processing is designated, it is determined whether or not the dummy processing-improving function is disabled (step S802). More specifically, it is determined whether or not the value of the parameter 600 is set to "00:00:00". If the dummy processing-improving function is enabled, i.e. if the value of the parameter 600 is not set to "00:00:00", it is determined whether or not the process chambers 106 and 107 are on line (i.e. whether or not the process chambers 106 and 107 are connected to the host computer 200) (step S803). If the process chambers 106 and 107 are on line, it is determined whether or not it is after the electric power has been switched from the OFF state to the ON state, and before the start of execution of etching on a first substrate of a first substrate lot to be processed after power-on (step S804).

If it is determined in the step S804 that the present substrate is not a first substrate of a first lot after power-on, it is determined whether or not the preceding substrate lot was subjected to etching in the off-line state (step S805). If the preceding substrate lot was subjected to etching in the on-line state, it is determined whether or not there is a substrate subjected to etching or a non-product substrate subjected to dummy processing after execution of maintenance of the process chambers (P/C) 106 and 107 (step S806). If there is a substrate subjected to etching or a non-product substrate subjected to dummy processing after execution of the maintenance, it is determined whether or not the preceding substrate lot was aborted by an abort function (step S807). The abort function forcibly terminates substrate transfer or execution of etching when an error occurs during execution of etching on one of substrate lots continuously transferred. In the case where a plurality of substrate lots are continuously transferred, when a preceding substrate lot is aborted, the following substrate lot is also aborted automatically.

If it is determined in the step S807 that no substrate lot was aborted, the process proceeds to a step S808, wherein it is determined whether or not a predetermined time period set as the parameter 600, i.e. "the chamber standing time" has elapsed (timed out) after the execution end time of the main step (etching) executed on the preceding substrate lot, which is set as the time count start reference time.

It should be noted that before the start of the counting of the chamber standing time in the step S808, the product processing recipe is executed, so that the count of a timer, not shown, is first set to "0" when RF power is applied to the upper electrode plate and the lower electrode plate, and then the set count of the timer is held at "0" during execution of the main step (see FIG. 3, e.g. STEPS1 to 24 (in FIG. 3, only STEPS1 to 6 are shown). The holding of the count is canceled immediately when the main step is completed. After cancellation of the holding of the timer count at "0", when re-execution processing is carried out for re-executing the main step, RF power is applied again, and the timer count is reset to "0", whereas when the abort processing is executed for forcible termination, i.e. interruption, of the main step, the timer count is not reset to "0".

Figure 10:
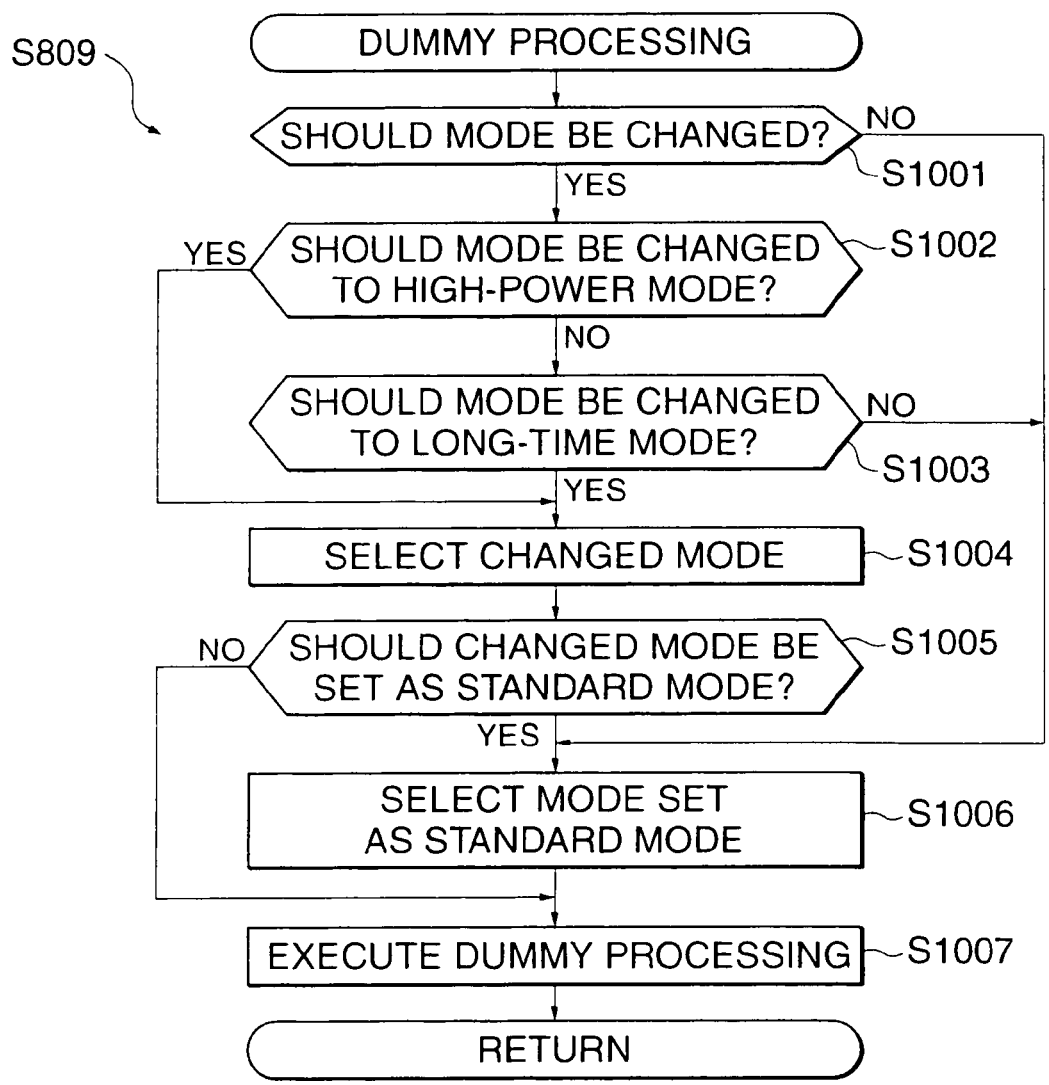
FIG. 10 is a flowchart showing details of dummy processing executed in a step S809 in FIG. 8.

If it is determined in the steps S802 to S808 that any of the requirements for execution of the dummy processing is satisfied, i.e. the dummy processing-improving function is disabled (YES to the step S802); the process chambers 106 and 107 are in the off-line state (NO to the step S803); the present substrate lot is the first lot after power-on (YES to the step S804); the preceding substrate lot was subjected to etching in the off-line state (YES to the step S805); there is no substrate subjected to etching after the P/C maintenance (YES to the step S806); the preceding substrate lot was aborted (YES to the step S807); or the chamber standing time has elapsed, at least one non-product substrate is subjected to the dummy processing, as described in detail hereinafter with reference to FIG. 10, in a step S809, and the process proceeds to the step S810. In the step S810, the substrates included in the substrate lot are all subjected to product processing (etching), followed by terminating the process. Thus, after occurrence of an irregular situation where dummy processing should be executed, dummy processing is carried out on one to three non-product substrates before each execution of product processing in the step S810. As a result, the processing atmosphere in each of the process chambers 106 and 107 can be reliably stabilized.

On the other hand, if it is determined in the step S808 that the chamber standing time has not elapsed, which means that the processing atmosphere within a process chamber used for etching the preceding substrate lot is held in a stable state, the dummy processing in the step S809 is skipped (omitted), and the process proceeds to the step S810. In the step S810, the substrates included in the substrate lot are all subjected to etching (product processing), followed by terminating the present process.

According to the process in FIG. 8, when the chamber standing time has not elapsed (NO to the step S808), the dummy processing in the step S809 is omitted, judging that the process chamber used for etching the preceding substrate lot has been kept stable, and the substrates in the substrate lot are subjected to etching (step S810). As a result, it is possible not only to reduce consumption of non-product substrates, but also to enhance productivity in manufacturing product substrates.

If it is determined in the steps S804 to S808 that at least one of the process chambers 106 and 107 corresponds to the affirmative answer "YES", the process proceeds to the step S809.

It is preferable that the steps S800 to S808 in FIG. 8 are executed in a state where transfer of a first substrate in a substrate lot can be started.

In the following, a description will be given of a first variation of the substrate processing method according to the present embodiment.

In the present variation, the substrate processing system is configured such that it is possible to set whether or not the following substrate lot is to be automatically aborted, which is determined in the abort processing in the step S807. More specifically, this setting can be made according to configuration parameters which can be changed by the host computer 200, and whether or not a preceding substrate lot and the following substrate lot were aborted is recorded in a process log as a log of the whole process (see FIG. 9A, with reference to which a detailed description will be given hereinafter).

Therefore, even when a preceding substrate lot and the following substrate lot are subjected to product processing via the common transfer chamber 104 (see FIG. 2), it is possible to configure such that the product processing is to be carried out without automatic execution of abort processing on the following substrate lot. In this case, it is determined in the step S807 that the preceding substrate lot was aborted, and the dummy processing is executed whenever the answer to the question of the step S807 is affirmative, so that it is possible to dispense with the step S808 in which whether or not the dummy processing should be executed is determined based on the chamber standing time (parameter 600 "chamber standing time" forcible termination option).

In the following, a description will be given of a second variation of the substrate processing method according to the present embodiment.

In the present variation, the result of dummy processing executed on a non-product substrate is recorded in the host computer 200, as a process log as a log of the whole process, or as a dummy process log.

FIG. 9A is a view showing an example of the process log recorded in the host computer 200, and FIG. 9B is a fragmentary view showing an example of the dummy process log as the result of dummy processing executed on a non-product substrate.

In the process log an example of which is shown in FIG. 9A, operations of the whole process are recorded on a lot-by-lot basis, and whether or not the abort processing was executed and whether or not there is a substrate subjected to error processing (error substrate) are displayed in the leftmost column of the process log. For example, when abort processing was executed, a mark "■" is displayed, and when abort processing was not executed, a mark "○" is displayed. Further, when there was no error substrate, the mark "○" is displayed, and when there was an error substrate, a mark "▼" is displayed. That is, when processing was normally terminated, the mark "○" is displayed. In the FIG. 9A example, only the mark "○" is displayed for all jobs, since the processing was normally terminated for all the jobs.

In FIG. 9A, substrate lots to which a name including "–ST" is given are substrate lots of non-product substrates subjected to dummy processing based on the dummy processing recipe-linking function or the lot stabilizing dummy processing function. Further, substrate lots to which a name including "–PL" is given are substrate lots of non-product substrates subjected to dummy processing based on a plasma cleaning recipe-linking function.

If a substrate (wafer)-listing button is depressed in the state of a substrate lot being selected on a display screen in FIG. 9A, the screen is switched to a display screen shown in FIG. 9B.

FIG. 9B is a display screen for listing substrates of a substrate lot whose lot name includes "–ST", when the substrate lot is selected. As shown in FIG. 9B, dummy slot numbers "–Dx" different from each other are given to three non-product substrates, so as to enable the user to visually recognize which non-product substrate was subjected to dummy processing or which non-product substrate execution of dummy processing was omitted for. This makes it possible to collect log information from the process log and the dummy process log e.g. when a trouble occurs in the etching apparatus 100.

In recent years, with miniaturization of portions of semiconductor devices to be processed, there is a demand for a plasma etching apparatus which has an excellent CD (Critical Dimension) controllability and a stable processing performance. For example, to manufacture semiconductor devices with the line width of wiring formed on an dielectric film on a substrate being approximately 90 nm, etching for dielectric films is demanded of (1) advanced HARC (High Aspect Ratio Contact) control for etching linear grooves with an aspect ratio of 20 or more, (2) advanced CD control with argon fluoride (ArF) and hard mask etching for gates, and (3) high processing capability of processing low-k material (dielectric constant k of not more than 2.5) for a damascene process for embedding a metal in a desired portion of a substrate in a chip manufacturing process. These requirements are becoming more and more demanding, and the above-mentioned line width is required to be not more than 65 nm, for example.

Therefore, it is necessary for the plasma etching apparatus to control temperature more delicately by more highly advanced technology than the conventional plasma etching apparatuses and stably maintain the controlled temperature to thereby enhance stability of the processing atmosphere within the process chambers for achievement of more excellent CD controllability. For example, to etch substrates having a diameter of 300 mm with a line width of approximately 90 nm, an atmosphere temperature within the process chamber is required to be kept stable within a range of 115 to 121° C.

Normally, two or three non-product substrates are used to stabilize the atmosphere temperature. In other words, it is necessary to carry out dummy processing two or three times. This is because the temperature within the process chamber reaches no higher than 104 to 110° C. after one-time execution of dummy processing, and consequently the atmosphere temperature is unstable, which causes a few first processed substrates of a substrate lot subjected to the following product processing to be out of or fail to satisfy the specification for product substrates.

In an attempt to solve this problem, the present inventors made assiduous studies and found that even one-time execution of dummy processing can enhance stability of the atmosphere temperature by providing operation modes for dummy processing, i.e. a long-time mode and a high-power mode, described in detail hereinafter, by changing part of the configuration of a step most contributing to stability of the atmosphere temperature in the normal dummy processing recipe (normal mode of dummy processing) similar to the product processing recipe, i.e. the main step in which processing is carried out at the highest temperature, and causing the etching apparatus 100 to execute the dummy processing in the step S809 in at least one of the operation modes. This makes it possible to reduce not only the number of executions of dummy processing, i.e. time required for dummy processing, but also the number of non-product substrates or substrates out of the specification in product processing, which contributes to improvement of throughput and resulting enhancement of the productivity of the etching apparatus 100.

In the long-time mode, processing time in the main step (etching) is made longer than in the normal mode. For example, processing time in the main step, which is set to five minutes in the normal mode of dummy processing, is changed to seven minutes in the long-time mode.

It is preferable that for the long-time mode, the processing time in the main step is set to a time period determined empirically or experimentally in advance according to the diameter of the substrate and/or the kinds of process gases. Alternatively, the processing time may be determined according to the processing atmosphere, for example, temperatures of the center, middle, and peripheral edge of the process chamber 106 (107), for example, which are measured by a cleaning plate, not shown, mounted to the upper electrode. If the processing time is set to too long a time period, energy is consumed wastefully, and therefore, it is preferable to set the same within a range between a normal time period and twice the same.

In the high-power mode, power applied in the main step to generate RF power is increased to a higher level than in the normal mode.

It is preferable that for the high-power mode, the value of the RF power is determined empirically or experimentally in advance, as in the case of the long-time mode, according to the diameter of the substrate and/or the kinds of process gases. Alternatively, the set value of the RF power may be determined according to the processing atmosphere. If the set value of the RF power is too high, energy is consumed wastefully, and therefore, it is preferable to set the same within a range between a normal level and twice the same.

FIG. 10 is a flowchart showing details of the dummy processing executed in the step S809 in FIG. 8.

As shown in FIG. 10, first, it is determined in a step S1001 whether or not the operation mode for dummy processing should be changed. As described above, the operation modes for dummy processing include the high-power mode and the long-time mode in addition to the normal mode in which the same processing as the product processing executed in the step S810 is carried out as dummy processing. The normal mode is set as a standard operation mode to be normally selected.

It is preferable that the mode change to the high-power mode or the long-time mode in the step S1001 is carried out when the processing atmosphere within the process chamber is not stable, e.g. when the parameter 600 in FIG. 7, i.e. the "chamber standing time" is set to not shorter than one hour and the chamber standing time has elapsed in the step S808. Further, it is preferable that the mode change to the high-power mode or the long-time mode is carried out when high stability of the processing atmosphere is required, e.g. when the diameter of a substrate to be processed is not less than 300 mm, or when the line width with which the substrate is to be etched is not more than 90 nm.

If the operation mode for dummy processing should be changed (YES to the step S1001), a desired one of the high-power mode and the long-time mode is selected (YES to a step S1002 or S1003, and a step S1004), and the process proceeds to a step S1005. In the step S1005, it is determined whether or not the selected one of the high-power mode and the long-time mode should be set as the standard operation mode. If the selected mode should be set as the standard operation mode, the process proceeds to a step S1006, whereas if the selected mode should not be set as the standard operation mode, the process skips over the step S1006 to a step S1007.

On the other hand, if the operation mode should not be changed (NO to the step S1001), or if neither the high-power mode nor the long-time mode has been selected (NO to the steps S1002 and S1003), the normal mode as the standard operation mode is selected (step S1006), and the process proceeds to the step S1007. Further, if one of the high-power mode and the long-time mode has been set as the standard operation mode (YES to the step S1002 or S1003, and YES to the step S1005), the operation mode for dummy processing, set as the standard operation mode, is selected (step S1006), and the process proceeds to the step S1007.

In the step S1007, dummy processing is carried out on at least one non-product substrate in the selected operation mode for dummy processing. More specifically, if the selected operation mode is either the high-power mode or the long-time mode, dummy processing is carried out on only one non-product substrate in the selected operation mode, whereas if the selected operation mode is the normal mode, dummy processing is carried out on at least one non-product substrate, e.g. on three non-product substrates, in the normal mode.

According to the process in FIG. 10, the operation mode for dummy processing is changed to the high-power mode or the long-time mode based on the level of stability of the processing atmosphere, which is required for the product processing in the step S810 (step S1004), and only one-time dummy processing is executed in the selected operation mode. As a result, the productivity of the etching apparatus 100 can be enhanced.

The operation modes described above may not include one of the high-power mode and the long-time mode, or may further include a mode which is a combination of the recipes of the high-power mode and the long-time mode. Further, programs for implementing the respective operation modes may be provided separately in association with the respective operation modes, or alternatively a program for implementing the normal mode and another program for changing the program for implementing the normal mode in accordance with a selected one of the high-power mode and the long-time mode may be provided.

Further, although in the process in FIG. 10, the operation mode is changed, this is not limitative, but the process may be configured such that the user can change the processing time and the set value of the RF power for use in the main step set forth in the recipe for the normal dummy processing.

In the above described embodiment, some kinds of process gases can change the processing atmosphere to an atmosphere unsuitable for product processing, and therefore it is preferable that a step of carrying out dry cleaning using a single gas, such as an oxygen ($O_2$) gas, after execution of the main step is added to the recipe for dummy processing. An example of the above-mentioned atmosphere unsuitable for product processing is an atmosphere in which a deposit (particles) is liable to be formed on a substrate due to a process gas containing $C_4F_6$.

The substrate processing apparatus according to the present embodiment is not limited to the etching apparatus 100 as shown in FIG. 2, but variations thereof described below are possible.

Figure 11:
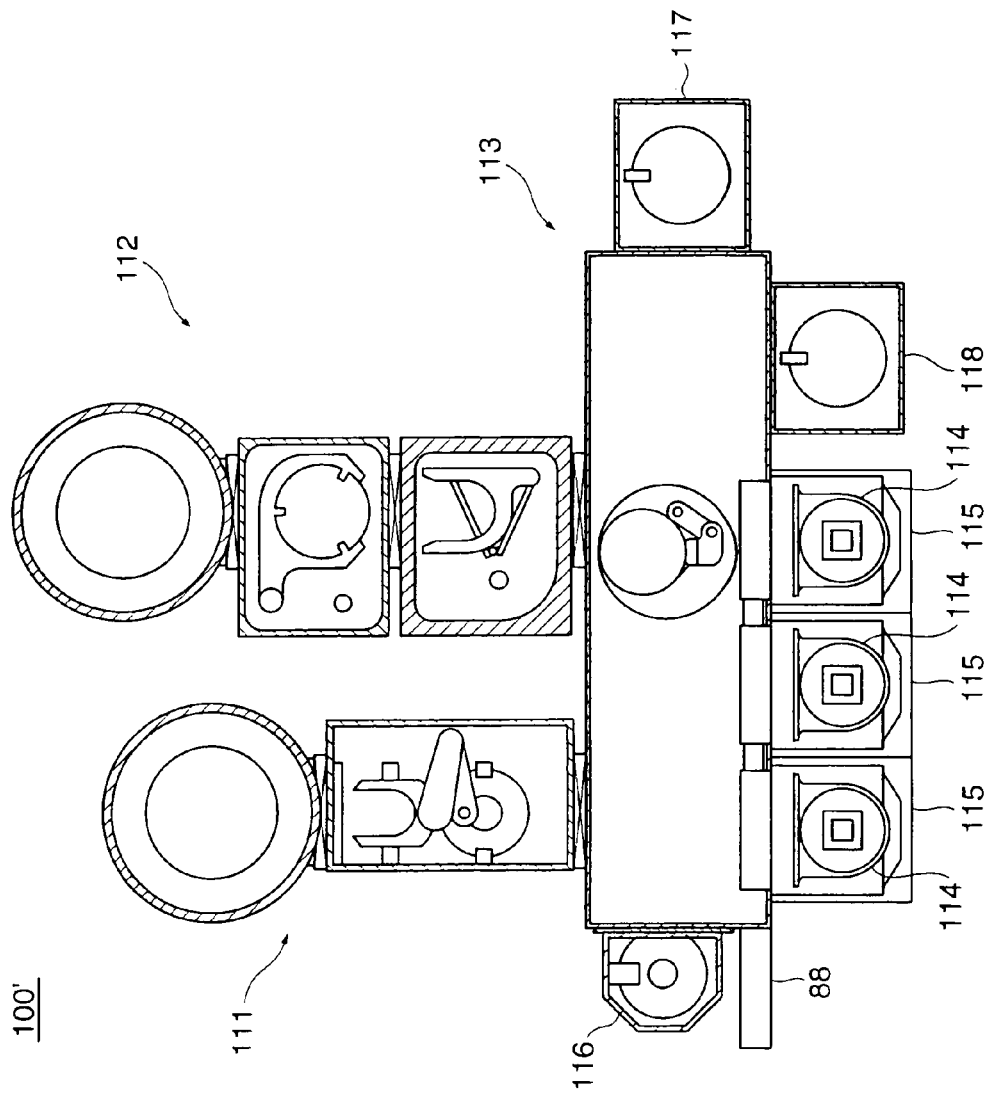
FIG. 11 is a view schematically showing the arrangement of a first variation of the substrate processing apparatus according to the embodiment.

FIG. 11 is a view schematically showing the arrangement of a first variation of the substrate processing apparatus according to the present embodiment.

As shown in FIG. 11, the substrate processing apparatus 100' as the first variation is comprised of a first processing ship 111 including a process chamber (P/C) for carrying out reactive ion etching (RIE) using plasma on a substrate W, a second processing ship 112 disposed parallel with the first processing ship 111 and including a process chamber (P/C) for carrying out a COR (Chemical Oxide Removal) process and a PHT (Post Heat Treatment) process on the substrate W subjected to RIE, a loader unit 113 having a rectangular shape as a common transfer chamber (T/C) and connected to the first processing ship 111 and the second processing ship 112, three FOUP mounting bases 115 connected to the loader unit 113, an orienter 116 as a pre-alignment section (P/A) connected to the loader unit 113, for pre-aligning the position of a transferred substrate W, first and second IMSs (Integrated Metrology Systems: available from Therma-Wave, Inc.) connected to the loader unit 113, for measuring the surface status of the substrate W, and an operation controller 88 connected to the loader unit 113. On each of the FOUP mounting bases 115, a FOUP (Front Opening Unified Pod) 114 is mounted as a container capable of containing twenty-five substrates W including non-product substrates for dummy processing.

Figure 12:
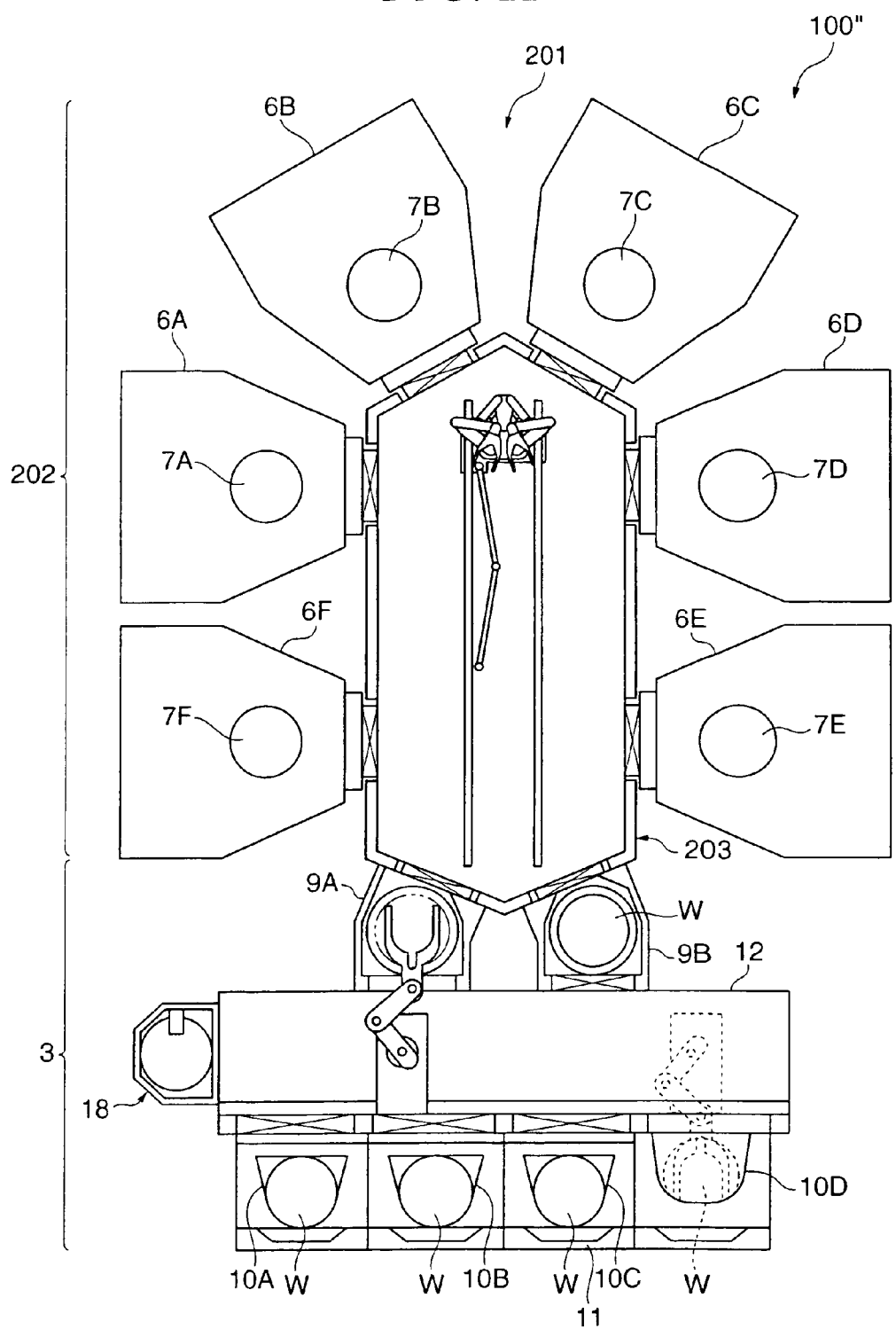
FIG. 12 is a view schematically showing the arrangement of a second variation of the substrate processing apparatus according to the embodiment.

FIG. 12 is a view schematically showing the arrangement of a second variation of the substrate processing apparatus according to the present embodiment.

As shown in FIG. 12, the substrate processing apparatus 100" as the second variation is comprised of a substrate processing section 202 including process chambers (P/C) for carrying out various types of processing, such as film formation, diffusion, and etching, on substrates W on a substrate-by-substrate basis, a substrate storing section 3 for storing not only unprocessed substrates W but also substrates W processed in the substrate processing section 202, and a transfer chamber (T/C) 203 for transferring a substrate W between the substrate processing section 202 and the substrate storing section 3. The substrate processing section 202 includes six P/Cs 6A to 6F connected to the T/C 203.

The substrate storing section 3 is comprised of a FOUP mounting base 11 on which four FOUPs 10A to 10D can be mounted, two load lock (L/L) chambers 9A and 9B connected to the T/C 203, a loader unit 12 of an atmosphere transport system, which is disposed between the FOUP mounting base 11 and the L/L chambers 9A and 9B, an orienter 18 as a pre-alignment section (P/A) for pre-aligning the position of a substrate W, and two FOUPs, not shown, for non-product substrates, which are mounted on the front side surface of the loader unit 12 at respective locations below the L/L chambers 9A and 9B. Each of the FOUPs 10A to 10D contains twenty-five substrates W, for example, and each of the FOUPs for non-product substrates contains a predetermined number of non-product substrates for dummy processing which are used for trial operation of the substrate processing apparatus 100".

As described above, the substrate processing apparatus 100" as the second variation of the present embodiment is provided with the six P/Cs 6A to 6F, i.e. more P/Cs than in the etching apparatus 100 in FIG. 2, so that more substrates W can be processed simultaneously, which makes it possible to improve the substrate processing efficiency of the substrate processing apparatus.

Although in the above described embodiment, substrates to be processed are semiconductor substrates, this is not limitative, but the present invention may be applied to processing of glass substrates for LCDs, FPDs (Flat Panel Displays), and the like.

It is to be understood that the object of the present invention may also be accomplished by supplying a computer or a CPU with a program code of software, which realizes the functions of the above described embodiment, and causing the computer or CPU to read out and execute the program code.

The above program has only to realize the functions of the above described embodiment on a computer, and the form of the program may be an object code, a program code executed by an interpreter, or script data supplied to an OS.

Further, it is to be understood that the object of the present invention may also be accomplished by supplying a system or an apparatus with a storage medium in which a program code of software, which realizes the functions of the above described embodiment is stored, and causing a computer (or CPU or MPU) of the system or apparatus to read out and execute the program code stored in the storage medium.

In this case, the program code itself read from the storage medium realizes the functions of the above described embodiment, and therefore the program code and the storage medium in which the program code is stored constitute the present invention.

Examples of the storage medium for supplying the program code include a floppy (registered trademark) disk, a hard disk, a magnetic-optical disk, a CD-ROM, a CD-R, a CD-RW, a DVD-ROM, a DVD-RAM, a DVD-RW, a DVD+RW, a magnetic tape, a nonvolatile memory card, and a ROM. Alternatively, the program may be downloaded via a network from another computer, a database, or the like, not shown, connected to the Internet, a commercial network, a local area network, or the like.

Further, it is to be understood that the functions of the above described embodiment may be accomplished not only by executing the program code read out by a computer, but also by causing an OS (operating system) or the like which operates on the computer to perform a part or all of the actual operations based on instructions of the program code.

Further, it is to be understood that the functions of the above described embodiment may be accomplished by writing a program code read out from the storage medium into a memory provided on an expansion board inserted into a computer or a memory provided in an expansion unit connected to the computer and then causing a CPU or the like provided in the expansion board or the expansion unit to perform a part or all of the actual operations based on instructions of the program code.

The present invention is not limited to the above described embodiment, but can be modified in various manners based on the subject matter of the present invention, which should not be excluded from within the scope of the present invention insofar as functions as recited in the appended claims or the functions performed by the construction of the above described embodiment can be achieved.

The invention claimed is:

1. A substrate processing method for a substrate processing apparatus, the apparatus including at least one process chamber in which predetermined processing is carried out on a substrate as an object to be processed, the method comprising:
   a dummy processing step of carrying out dummy processing on a non-product substrate; and
   a determining step of determining whether or not the dummy processing is to be executed, wherein:
   said determining step includes a stability determining step of determining whether or not an interior of the process chamber is in a stable state;
   said dummy processing step includes a dummy processing omitting step of omitting the execution of the dummy processing when it is determined in said stability determining step that the interior of the process chamber is in the stable state;
   a power applied in a main step, in which processing is carried out at the highest temperature, for the dummy processing to be carried out once is increased to a higher level than a power applied in a main step for the predetermined processing to be carried out on the substrate;
   when a standing time over which the process chamber is left standing and counting of which is started from a time count start reference time set to an execution end time of the predetermined processing has not exceeded a predetermined time period, it is determined in said stability determining step that the interior of the process chamber is in the stable state; and
   said predetermined time period is longer than a time interval between successive lot transfers, whereby constant execution of the dummy processing between successive lot transfers can be prevented.

2. A substrate processing method as claimed in claim 1, wherein the determination in said determining step is performed based on preset dummy processing execution requirements or dummy processing non-execution requirements, the dummy processing non-execution requirements including a condition that the standing time does not exceed the predetermined time period.

3. A substrate processing method as claimed in claim 2, wherein the dummy processing non-execution requirements include a condition that the non-product substrate does not exist.

4. A substrate processing method as claimed in claim 2, wherein the dummy processing non-execution requirements include a condition that execution of the dummy processing on the non-product substrate before execution of the predetermined processing on the substrate is not designated.

5. A substrate processing method as claimed in claim 2, wherein the dummy processing execution requirements include a condition that it is configured such that omission of execution of the dummy processing in said dummy processing omitting step is disabled.

6. A substrate processing method as claimed in claim 2, wherein the dummy processing execution requirements include a condition that the process chamber is in an off-line state.

7. A substrate processing method as claimed in claim 2, wherein the dummy processing execution requirements include a condition that the substrate is a first substrate to be processed after power of the substrate processing apparatus is turned on.

8. A substrate processing method as claimed in claim 2, wherein the dummy processing execution requirements include a condition that a substrate processed before the substrate was processed in an off-line state.

9. A substrate processing method as claimed in claim 2, wherein the dummy processing execution requirements include a condition that the substrate is a first substrate to be processed after execution of maintenance of the process chamber.

10. A substrate processing method as claimed in claim 2, wherein the dummy processing execution requirements include a condition that abort processing for forcibly terminating processing being executed was executed on a substrate which was being processed immediately before processing of the substrate.

11. A substrate processing method as claimed in claim 1, wherein when it is determined in said stability determining step that the interior of the process chamber is not in the stable state, the dummy processing is carried out once in said dummy processing step.

12. A substrate processing method as claimed in claim 1, wherein processing time of the dummy processing carried out once is longer than processing time of the predetermined processing to be carried out on the substrate.

13. A substrate processing method as claimed in claim 1, wherein said determining step comprises performing determination for each substrate lot including the substrate.

14. A substrate processing method as claimed in claim 1, comprising an abort processing setting step of allowing setting to be made as to whether or not the abort processing is to be executed on the substrate, after abort processing for forcibly terminating processing being executed was executed on a substrate which was being processed immediately before processing of the substrate.

15. A substrate processing method as claimed in claim 1, comprising a log recording step of recording a log indicative of whether or not execution of the dummy processing was omitted.

16. A non-transitory computer-readable storage medium storing a program for causing a computer to execute a substrate processing method for a substrate processing apparatus including at least one process chamber in which predetermined processing is carried out on a substrate as an object to be processed, the substrate processing method comprising:
a dummy processing step of carrying out dummy processing on a non-product substrate; and
a determining step for determining whether or not the dummy processing is to be executed, wherein:
said determining step includes a stability determining step of determining whether or not an interior of the process chamber is in a stable state;
said dummy processing step includes a dummy processing omitting step of omitting the execution of the dummy processing when said stability determining step determines that the interior of the process chamber is in the stable state;
a power applied in a main step, in which processing is carried out at the highest temperature, for the dummy processing to be carried out once is increased to a higher level than a power applied in a main step for the predetermined processing to be carried out on the substrate;
when a standing time over which the process chamber is left standing and counting of which is started from a time count start reference time set to an execution end time of the predetermined processing has not exceeded a predetermined time period, it is determined in said stability determining step that the interior of the process chamber is in the stable state; and
said predetermined time period is longer than a time interval between successive lot transfers, whereby constant execution of the dummy processing between successive lot transfers can be prevented.

17. A substrate processing method as claimed in claim 1, wherein dry cleaning using a single gas is carried out after execution of the dummy processing.

* * * * *